United States Patent
Fujimoto et al.

(10) Patent No.: US 8,492,814 B2
(45) Date of Patent: *Jul. 23, 2013

(54) SEMICONDUCTOR DEVICE AND METHOD OF MANUFACTURING THE SAME

(75) Inventors: Hiroyuki Fujimoto, Tokyo (JP); Shinpei Iijima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/592,865

(22) Filed: Aug. 23, 2012

(65) Prior Publication Data

US 2012/0313156 A1    Dec. 13, 2012

Related U.S. Application Data

(63) Continuation of application No. 12/850,092, filed on Aug. 4, 2010, now Pat. No. 8,278,172.

(30) Foreign Application Priority Data

Aug. 6, 2009  (JP) ................................. 2009-183286

(51) Int. Cl.
*H01L 27/06* (2006.01)
(52) U.S. Cl.
USPC ....... 257/296; 257/68; 257/302; 257/E27.016
(58) Field of Classification Search
USPC .......................................... 257/68, 296, 302
See application file for complete search history.

(56) References Cited

U.S. PATENT DOCUMENTS

| | | | |
|---|---|---|---|
| 7,781,285 B2 | 8/2010 | Kim et al. | |
| 8,058,168 B2 * | 11/2011 | Park et al. | 438/669 |
| 8,278,172 B2 * | 10/2012 | Fujimoto et al. | 438/268 |
| 8,378,417 B2 * | 2/2013 | Ogawa et al. | 257/329 |
| 2008/0149914 A1 | 6/2008 | Samuelson et al. | |
| 2010/0140688 A1 * | 6/2010 | Fujimoto | 257/329 |
| 2010/0181612 A1 * | 7/2010 | Kito et al. | 257/319 |
| 2010/0181614 A1 * | 7/2010 | Nojima | 257/329 |
| 2010/0244119 A1 * | 9/2010 | Fukuzumi et al. | 257/324 |
| 2011/0006360 A1 * | 1/2011 | Ikebuchi | 257/329 |
| 2011/0018056 A1 * | 1/2011 | Takeuchi | 257/329 |
| 2011/0073939 A1 * | 3/2011 | Mikasa | 257/330 |
| 2012/0028428 A1 * | 2/2012 | Son et al. | 438/270 |

FOREIGN PATENT DOCUMENTS

| | | |
|---|---|---|
| JP | 2004-186601 | 7/2004 |
| JP | 2004-319808 | 11/2004 |
| WO | WO 2005/036651 | 4/2005 |

* cited by examiner

*Primary Examiner* — Alexander Ghyka
(74) *Attorney, Agent, or Firm* — Young & Thompson

(57) ABSTRACT

A method of forming a semiconductor device includes the following processes. A pillar is formed which stands on a semiconductor substrate. A first insulating film is formed which covers a side surface of the pillar. An upper portion of the first insulating film is removed to expose a side surface of an upper portion of the pillar. A contact plug is formed, which contacts the side surface of the upper portion of the pillar and a top surface of the pillar.

9 Claims, 19 Drawing Sheets

B-B'

FIG. 1A
FIG. 1B
FIG. 1C
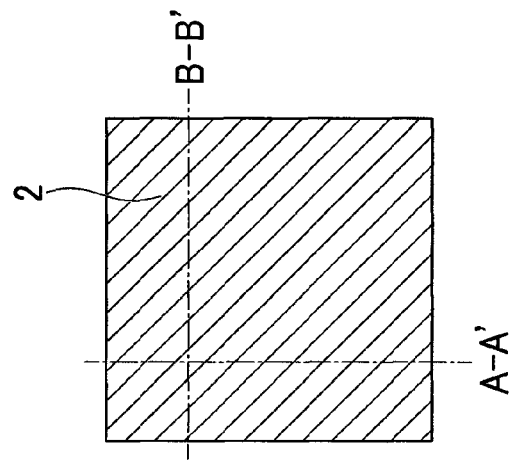
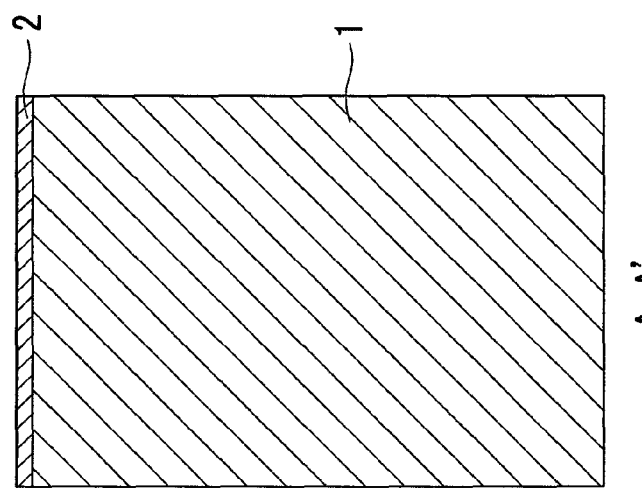
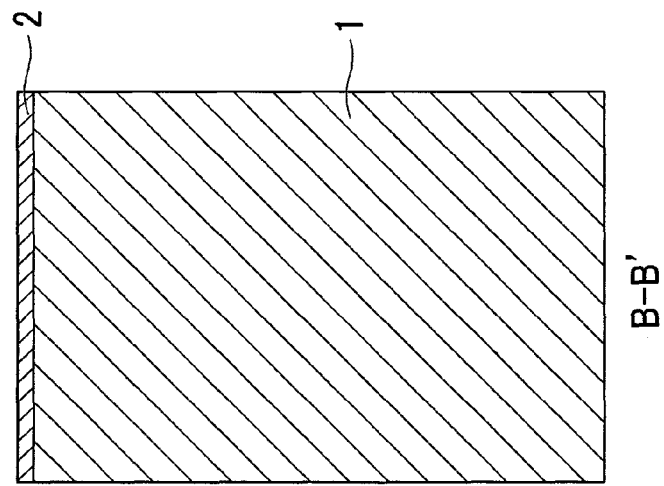

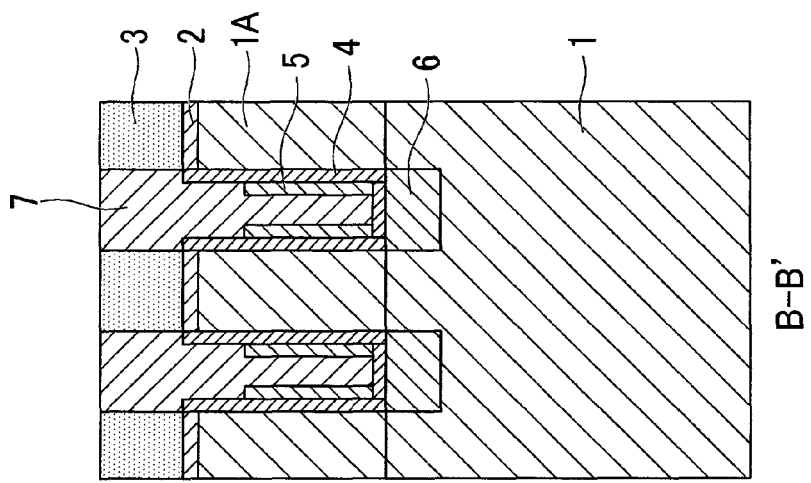
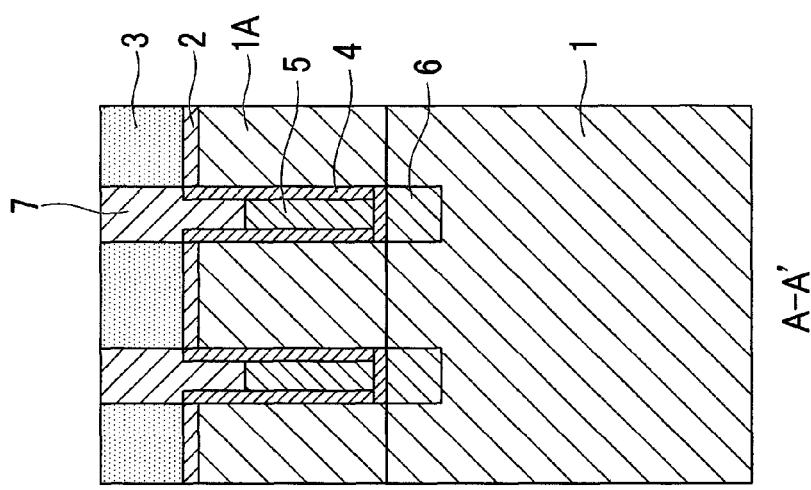
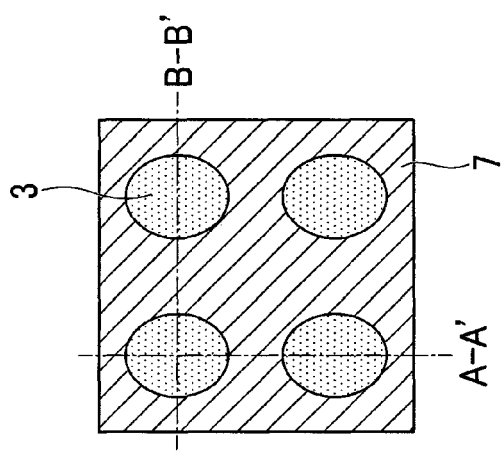

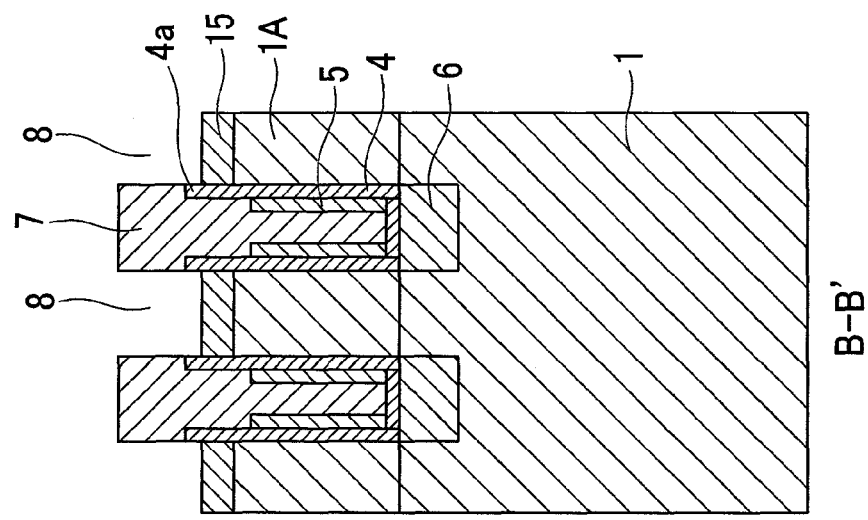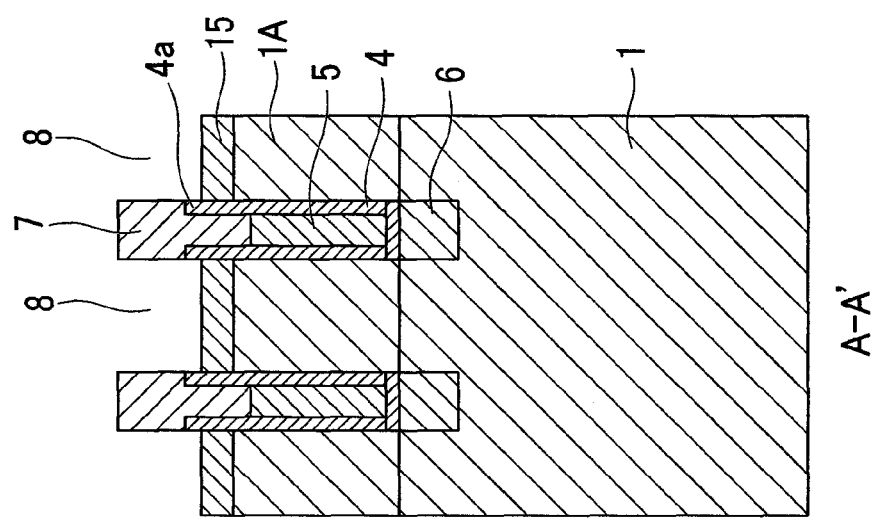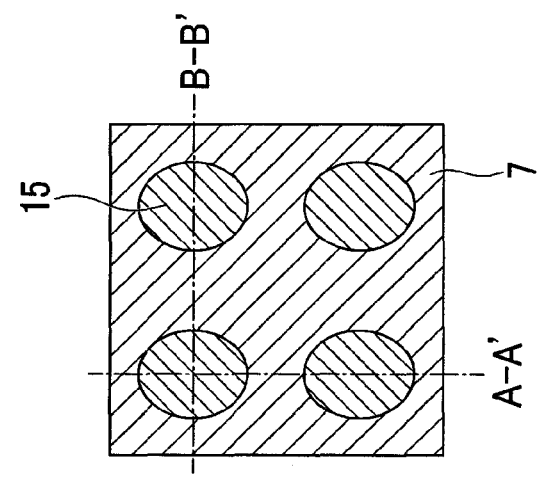

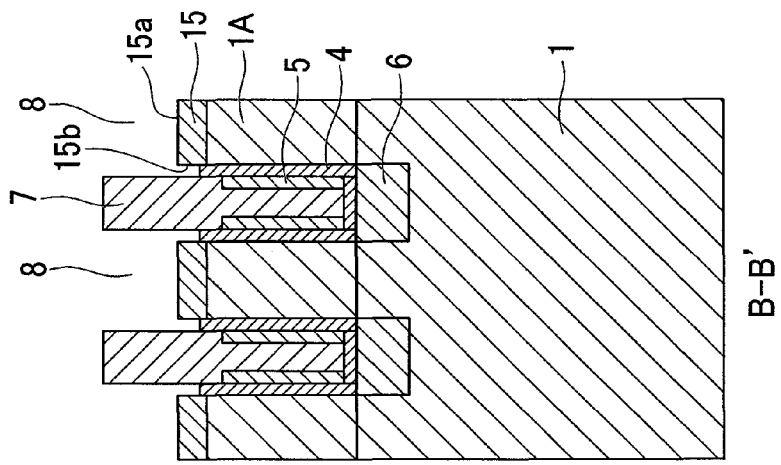
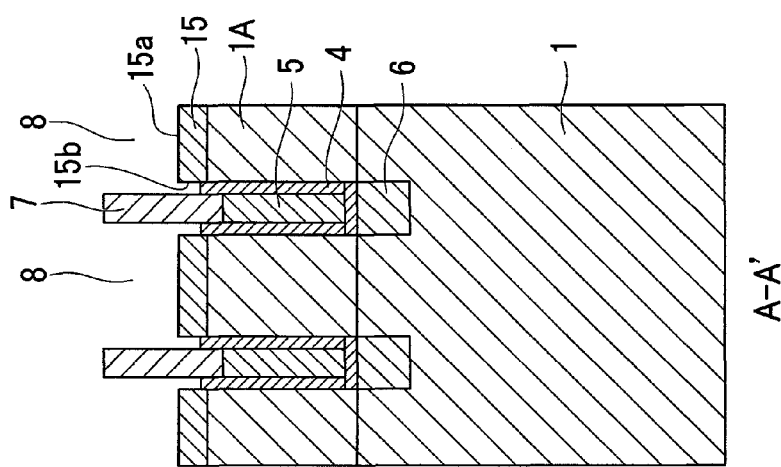
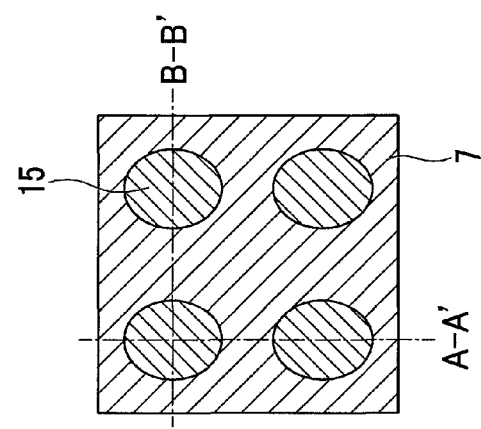

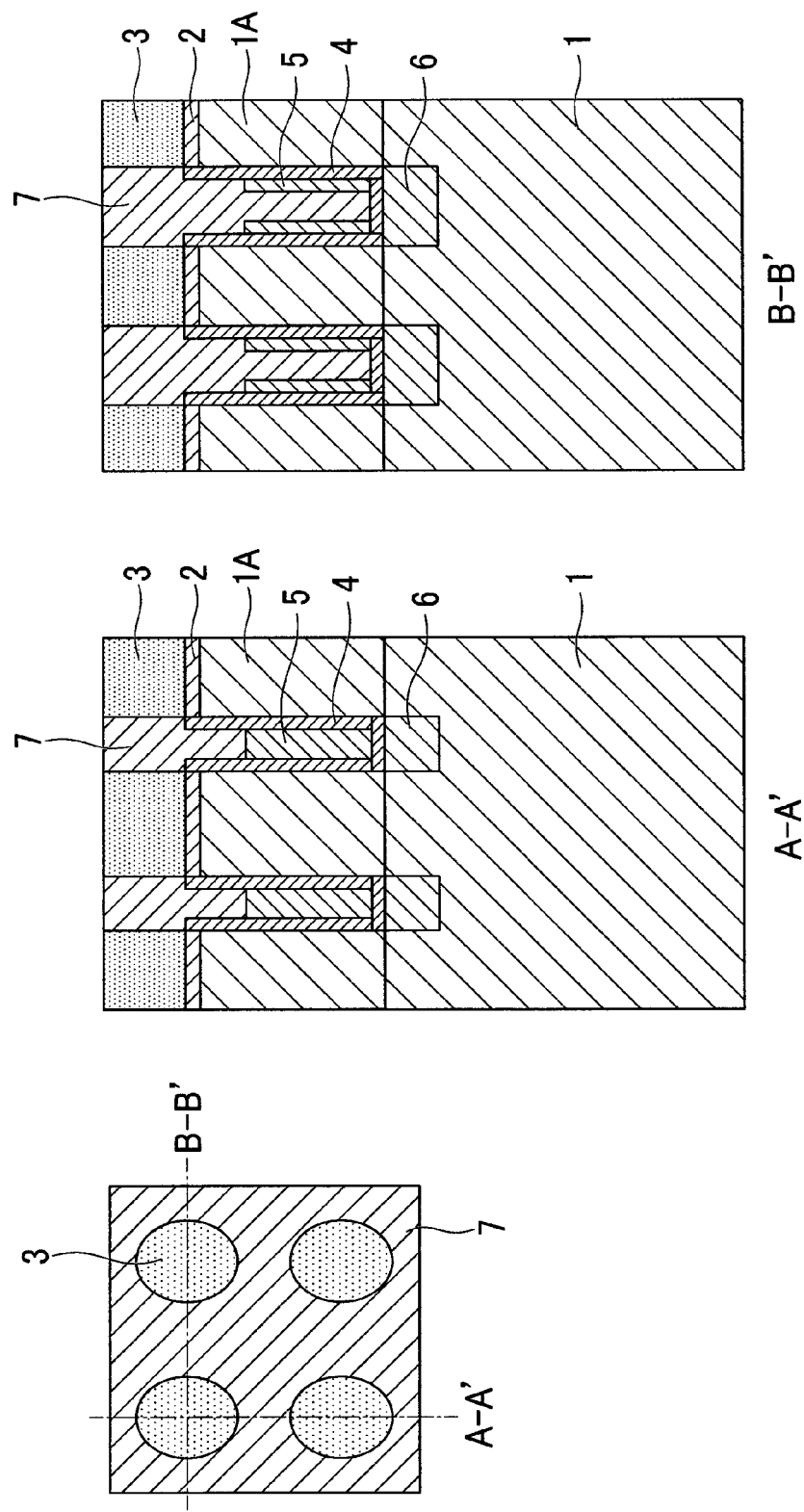

A-A'    B-B'

SEMICONDUCTOR DEVICE AND METHOD OF MANUFACTURING THE SAME

CROSS REFERENCE TO RELATED APPLICATIONS

This application is a continuation of co-pending application Ser. No. 12/850,092 filed on Aug. 4, 2010, which claims foreign priority to Japanese Application No. 2009-183286 filed on Aug. 6, 2009. The entire content of each of these applications is hereby expressly incorporated by reference.

BACKGROUND OF THE INVENTION

1. Field of the Invention

The present invention relates to a semiconductor device and a method of manufacturing the semiconductor device. More particularly, the present invention relates to a semiconductor device including a vertical device having a pillar so as to reduce contact resistance between an upper part of the pillar and a contact connected thereto, and a method of manufacturing the same.

Priority is claimed on Japanese Patent Application No. 2009-183286, filed Aug. 6, 2009, the content of which is incorporated herein by reference.

2. Description of the Related Art

In a Dynamic Random Access Memory (DRAM) of the related art, a memory cell includes a transistor and a capacitor. The increase in the integration of the DRAM has been achieved by progressing lithography technologies.

In the related art, a two-dimensional array of transistors is disposed on a semiconductor substrate. It is difficult to achieve further increase in the integration of the DRAM. A vertical transistor is suggested, which has a three-dimensional structure such that electrons can move in the direction vertical to the surface of the substrate.

Japanese Unexamined Patent Application, First Publication, No. JP-A-2004-319808 discloses a semiconductor device including a vertical MOS transistor. A trench isolation region is provided in a silicon substrate. A channel stopper region is provided on the bottom of the isolation region. A pillar-shaped semiconductor layer is provided on the silicon substrate. A drain region is provided on the pillar-shaped semiconductor layer. A source region filling the bottom of the pillar-shaped semiconductor layer is formed in the upper surface of the silicon substrate. A gate electrode having a barrier metal is disposed on a side surface of the pillar-shaped semiconductor layer through a gate oxide film. A conductive film is provided in contact with the upper part of the drain region. The drain region is provided on the pillar-shaped semiconductor layer. An AlCu wiring layer having bather metals, which are formed on upper and lower parts thereof, are connected through a contact plug having a barrier metal.

Japanese Unexamined Patent Application, First Publication, No. JP-A-2004-186601 discloses a semiconductor device including a vertical transistor. Pillar-shaped semiconductor layers are formed on a semiconductor substrate. A silicon oxide film is disposed on the bottom of a groove between the pillar-shaped semiconductor layers. An electrode is disposed on a gate insulating film. The electrode surrounds the peripheries of the pillar-shaped semiconductor layers. A selection gate transistor is configured as described above. Over the selection gate transistor, a floating gate is provided. A tunnel oxide film is disposed on the sidewall of each of the pillar-shaped semiconductor layers. The floating gate is disposed on the tunnel oxide film. The floating gate is separated by the tunnel oxide film from the pillar-shaped semiconductor layer. An interlayer insulating film is disposed over the control gate. The interlayer insulating film is disposed on an interlayer insulating film which covers the sidewall of the floating gate. A memory transistor is configured as described above. Over the memory transistor, the selection gate transistor is disposed. The selection gate transistor has the electrode which becomes the selection gate. The selection gate transistor is disposed on the gate insulating film. A source diffusion layer of a memory cell is disposed on the surface of the semiconductor substrate. A drain diffusion layer is disposed on the upper surface of each of the pillar-shaped semiconductor layers. The upper portion of the drain diffusion layer is not covered. An aluminum wiring is disposed covering the exposed upper part.

International Patent Publication No. WO2005/36651 discloses a semiconductor device having a buried conductor wiring which is in contact with an upper surface and with a side surface of a semiconductor protruding portion.

SUMMARY

In one embodiment, a method of forming a semiconductor device may include, but is not limited to, the following processes. A pillar is formed which stands on a semiconductor substrate. A first insulating film is formed which covers a side surface of the pillar. An upper portion of the first insulating film is removed to expose a side surface of an upper portion of the pillar. A contact plug is formed, which contacts the side surface of the upper portion of the pillar and a top surface of the pillar.

In another embodiment, a method of forming a semiconductor device may include, but is not limited to, the following processes. A first insulating mask is formed over a semiconductor substrate. A pillar is formed on the semiconductor substrate by using the first insulating mask. A first diffusion region is formed in the semiconductor substrate. The first diffusion region is formed near a bottom of the pillar. A first insulating film is formed, which covers a side surface of the pillar. A first electrode is formed, which faces toward the side surface of the pillar through the first insulating film. A second insulating film is formed, which covers the first electrode and the first insulating film. The first insulating mask is removed to expose a top surface of the pillar. A second diffusion region is formed at an upper portion of the pillar. An upper portion of the first insulating film is removed, to expose a side surface of the upper portion of the pillar. A contact plug is formed, which contacts both the top surface of the pillar and the side surface of the upper portion of the pillar.

In still another embodiment, a method of forming a semiconductor device may include, but is not limited to, the following processes. A first insulating mask is formed over a semiconductor substrate. A pillar is formed on the semiconductor substrate by using the first insulating mask. A first insulating film is formed, which covers a side surface of the pillar. A second insulating film is formed, which covers the first insulating film and the side surface of the pillar. The first insulating mask is removed to expose a top surface of the pillar. An upper portion of the first insulating film is removed, to expose a side surface of the upper portion of the pillar. A contact plug is formed, which contacts both the top surface of the pillar and the side surface of the upper portion of the pillar.

BRIEF DESCRIPTION OF THE DRAWINGS

The above features and advantages of the present invention will be more apparent from the following description of certain preferred embodiments taken in conjunction with the accompanying drawings, in which:

FIG. 1A is a fragmentary plan view illustrating a semiconductor device in a step involved in a method of forming the semiconductor device in accordance with a first preferred embodiment of the present invention;

FIG. 1B is a fragmentary cross sectional elevation view illustrating the semiconductor device, taken along an A-A' line of FIG. 1A, in accordance with the first preferred embodiment of the present invention;

FIG. 1C is a fragmentary cross sectional elevation view illustrating the semiconductor device, taken along a B-B' line of FIG. 1A, in accordance with the first preferred embodiment of the present invention;

FIG. 4A is a fragmentary plan view illustrating a semiconductor device in a step, subsequent to the step of FIGS. 3A, 3B and 3C, involved in the method of forming the semiconductor device in accordance with the first preferred embodiment of the present invention;

FIG. 4B is a fragmentary cross sectional elevation view illustrating the semiconductor device, taken along an A-A' line of FIG. 4A, in accordance with the first preferred embodiment of the present invention;

FIG. 4C is a fragmentary cross sectional elevation view illustrating the semiconductor device, taken along a B-B' line of FIG. 4A, in accordance with the first preferred embodiment of the present invention;

FIG. 5A is a fragmentary plan view illustrating a semiconductor device in a step, subsequent to the step of FIGS. 4A, 4B and 4C, involved in the method of forming the semiconductor device in accordance with the first preferred embodiment of the present invention;

FIG. 5B is a fragmentary cross sectional elevation view illustrating the semiconductor device, taken along an A-A' line of FIG. 5A, in accordance with the first preferred embodiment of the present invention;

FIG. 5C is a fragmentary cross sectional elevation view illustrating the semiconductor device, taken along a B-B' line of FIG. 5A, in accordance with the first preferred embodiment of the present invention;

FIG. 6A is a fragmentary plan view illustrating a semiconductor device in a step, subsequent to the step of FIGS. 5A, 5B and 5C, involved in the method of forming the semiconductor device in accordance with the first preferred embodiment of the present invention;

FIG. 6B is a fragmentary cross sectional elevation view illustrating the semiconductor device, taken along an A-A' line of FIG. 6A, in accordance with the first preferred embodiment of the present invention;

FIG. 6C is a fragmentary cross sectional elevation view illustrating the semiconductor device, taken along a B-B' line of FIG. 6A, in accordance with the first preferred embodiment of the present invention;

FIG. 11A is a fragmentary plan view illustrating a semiconductor device in a step, subsequent to the step of FIGS. 10A, 10B and 10C, involved in the method of forming the semiconductor device in accordance with the second preferred embodiment of the present invention;

FIG. 11B is a fragmentary cross sectional elevation view illustrating the semiconductor device, taken along an A-A' line of FIG. 11A, in accordance with the second preferred embodiment of the present invention;

FIG. 11C is a fragmentary cross sectional elevation view illustrating the semiconductor device, taken along a B-B' line of FIG. 11A, in accordance with the second preferred embodiment of the present invention;

DETAILED DESCRIPTION OF THE PREFERRED EMBODIMENTS

Figure 2C:
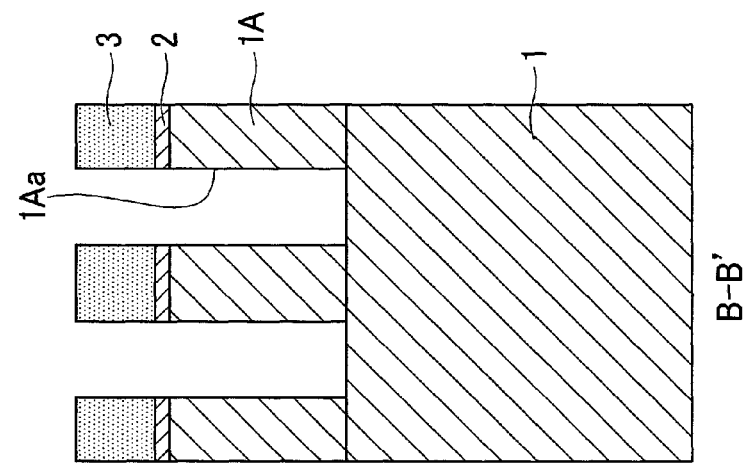
FIG. 2C is a fragmentary cross sectional elevation view illustrating the semiconductor device, taken along a B-B' line of FIG. 2A, in accordance with the first preferred embodiment of the present invention.

Before describing the present invention, the related art will be explained in detail, in order to facilitate the understanding of the present invention.

In accordance with the semiconductor layer suggested in Japanese Unexamined Patent Application, First Publication, No. JP-A-2004-319808, the contact area between the drain region of the pillar-shaped semiconductor layer and the contact plug through the conductive film and the barrier metal is equal to the area of the top surface of the pillar-shaped semiconductor layer on which the drain region is formed. The area of the top surface of the pillar-shaped semiconductor layer is reduced due to shrinkage of the device, resulting in reducing the width of the transistor. The contact area is reduced. The contact resistance is increased.

In accordance with the semiconductor device disclosed in Japanese Unexamined Patent Application, First Publication, No. JP-A-2004-186601, the upper portion of the drain diffusion layer and the aluminum wiring covering the upper part of the drain diffusion layer are not self-aligned. It is difficult to accurately align the upper portion of the drain diffusion layer and the aluminum wiring. Due to a misalignment, it is impossible to secure the contact area between the upper part of the drain diffusion layer and the aluminum wiring. In the semiconductor layer disclosed in International Patent Publication WO2005/36651, the semiconductor protruding portion and the buried conductor wiring are not self-aligned. It is difficult to secure the contact area.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of forming a semiconductor device may include, but is not limited to, the following processes. A pillar is formed which stands on a semiconductor substrate. A first insulating film is formed which covers a side surface of the pillar. An upper portion of the first insulating film is removed to expose a side surface of an upper portion of the pillar. A contact plug is formed, which contacts the side surface of the upper portion of the pillar and a top surface of the pillar.

In some cases, the method may include, but is not limited to, forming a first electrode on the first insulating film. The first electrode is separated by the first insulating film from the pillar.

In some cases, the method may include, but is not limited to, forming a second insulating film which covers the first electrode and the first insulating film.

In some cases, the pillar may be formed by, but not limited to, the following processes. A first insulating mask is formed over a semiconductor substrate. The semiconductor substrate is selectively removed by using the first insulating mask, to form the pillar.

In some cases, the pillar may be formed by, but not limited to, the following process. A first diffusion region is formed in the semiconductor substrate. The first diffusion region is formed near a bottom of the pillar, before forming the first insulating film.

In some cases, the pillar may be formed by, but not limited to, the following processes. The first insulating mask is removed to expose a top surface of the pillar after forming the second insulating film. A second diffusion region is formed at an upper portion of the pillar after removing the first insulating mask.

In some cases, the first insulating mask may be formed by, but not limited to, the following processes. A first inter-layer insulating film is formed on the semiconductor substrate. A second inter-layer insulating film is formed on the first inter-layer insulating film. The first and second inter-layer insulating films are patterned to form the first insulating mask.

In some cases, the first insulating film may be formed by, but not limited to, the following processes. The first insulating film is formed, which covers the side surface of the pillar and a side edge of the first inter-layer insulating film.

In some cases, the first insulating film may be formed by, but not limited to, the following processes. The first and second inter-layer insulating films removed, to expose a top edge of the first insulating film.

In some cases, the upper portion of the first insulating film may be removed by subjecting the top edge of the first insulating film to an etching process to remove the upper portion of the first insulating film.

In some cases, the method may include, but is not limited to, the following processes. A third insulating film is formed over the second insulating film. The third insulating film is patterned to form a mask pattern over the second insulating film.

In some cases, the third insulating film is patterned by carrying out an etching process under a condition that the third insulating film is higher in etching rate than the second insulating film. The etching process is followed by removing the second inter-layer insulator.

In another embodiment, a method of forming a semiconductor device may include, but is not limited to, the following processes. A first insulating mask is formed over a semiconductor substrate. A pillar is formed on the semiconductor substrate by using the first insulating mask. A first diffusion region is formed in the semiconductor substrate. The first diffusion region is formed near a bottom of the pillar. A first insulating film is formed, which covers a side surface of the pillar. A first electrode is formed, which faces toward the side surface of the pillar through the first insulating film. A second insulating film is formed, which covers the first electrode and the first insulating film. The first insulating mask is removed to expose a top surface of the pillar. A second diffusion region is formed at an upper portion of the pillar. An upper portion of the first insulating film is removed, to expose a side surface of the upper portion of the pillar. A contact plug is formed, which contacts both the top surface of the pillar and the side surface of the upper portion of the pillar.

In some cases, the first insulating mask may be formed by the following processes. A first inter-layer insulating film is formed on the semiconductor substrate. A second inter-layer insulating film is formed on the first inter-layer insulating film. The first and second inter-layer insulating films are patterned to form the first insulating mask. The first insulating film may be formed by, but not limited to, the following process. The first insulating film is formed, which covers the side surface of the pillar and a side edge of the first inter-layer insulating film.

In some cases, the method may include, but is not limited to, the following processes. The first and second inter-layer insulating films are removed together with a top portion of the first insulating film, to expose a top edge of the first insulating film. The upper portion of the first insulating film may be removed by, but not limited to, etching the top edge to remove the upper portion of the first insulating film.

In some cases, the method may include, but is not limited to, the following processes. A third insulating film is formed over the second insulating film. The third insulating film is patterned to form a mask pattern over the second insulating film. The third insulating film may be patterned by carrying out an etching process under a condition that the third insulating film is higher in etching rate than the second insulating film. The etching process is followed by removing the second inter-layer insulator.

In still another embodiment, a method of forming a semiconductor device may include, but is not limited to, the following processes. A first insulating mask is formed over a semiconductor substrate. A pillar is formed on the semiconductor substrate by using the first insulating mask. A first insulating film is formed, which covers a side surface of the pillar. A second insulating film is formed, which covers the first insulating film and the side surface of the pillar. The first insulating mask is removed to expose a top surface of the pillar. An upper portion of the first insulating film is removed, to expose a side surface of the upper portion of the pillar. A contact plug is formed, which contacts both the top surface of the pillar and the side surface of the upper portion of the pillar.

In some cases, the first insulating mask may be formed by the following processes. A first inter-layer insulating film is formed on the semiconductor substrate. A second inter-layer insulating film is formed on the first inter-layer insulating film. The first and second inter-layer insulating films are patterned to form the first insulating mask. The first insulating film may be formed by the following process. The first insulating film is formed which covers the side surface of the pillar and a side edge of the first inter-layer insulating film.

In some cases, the method may include, but is not limited to, the following processes. The first and second inter-layer insulating films are removed together with a top portion of the first insulating film, to expose a top edge of the first insulating film. The upper portion of the first insulating film may be removed by etching the top edge to remove the upper portion of the first insulating film.

In some cases, the method may include, but is not limited to, the following processes. The first and second inter-layer insulating films may be removed together with a top portion of the first insulating film, to expose a top edge of the first insulating film. The upper portion of the first insulating film may be removed by etching the top edge to remove the upper portion of the first insulating film.

In some cases, the method may include, but is not limited to, the following processes. A third insulating film is formed over the second insulating film. The third insulating film is patterned to form a mask pattern over the second insulating film. The third insulating film may be patterned by carrying out an etching process under a condition that the third insulating film is higher in etching rate than the second insulating film. The etching process is followed by removing the second inter-layer insulator.

In still another embodiment, a semiconductor device may include, but is not limited to, a pillar, a first insulating film which covers a side surface of the pillar except for a side surface of an upper portion of the pillar, and a contact plug which contacts the top surface and the side surface of the upper portion of the pillar. The contact plug contacts the top edge of the first insulating film. The semiconductor device may be a vertical transistor. The device may include an electrode on the first insulating film. The device may include a capacitor connected to the contact plug. The vertical device may be a vertical diode.

Hereinafter, embodiments of the present invention will be described in detail with reference to the drawings.

The following drawings illustrate the embodiments of the present invention. The size, thickness or dimension of each portion shown in the drawings may be different from a dimension relationship of an actual semiconductor device.

FIGS. 1A to 15C show a method of manufacturing a semiconductor device including a vertical MOS transistor. FIGS. 1A to 15A are plan views of a semiconductor device. FIGS. 1B to 15B are cross-sectional views taken along a line A-A' of FIGS. 1A to 15A, respectively. FIGS. 1C to 15C are cross-sectional views taken along a line B-B' of FIGS. 1A to 15A, respectively.

First Embodiment

A method of manufacturing a semiconductor device according to a first embodiment of the present invention will be described with reference to FIGS. 1A to 15C.

As shown in FIGS. 1A, 1B and 1C A, a silicon substrate 1 is thermally oxidized at 1000° C. for 15 seconds so as to form a silicon oxide film 2 (second interlayer film) on the surface of the silicon substrate 1.

Figure 2B:
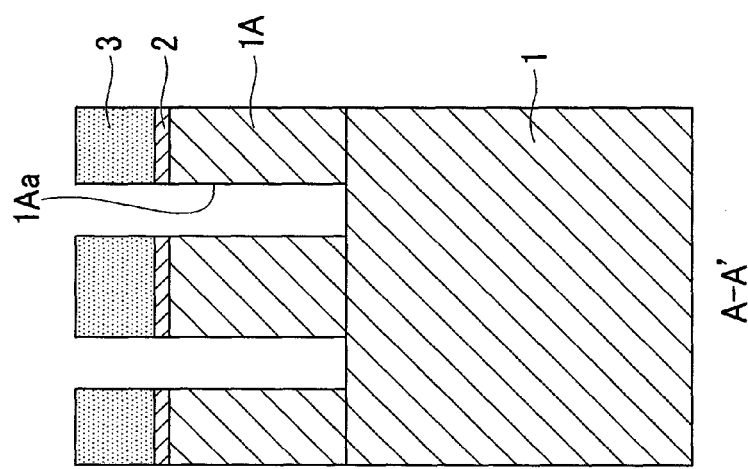
FIG. 2B is a fragmentary cross sectional elevation view illustrating the semiconductor device, taken along an A-A' line of FIG. 2A, in accordance with the first preferred embodiment of the present invention.
Figure 2A:
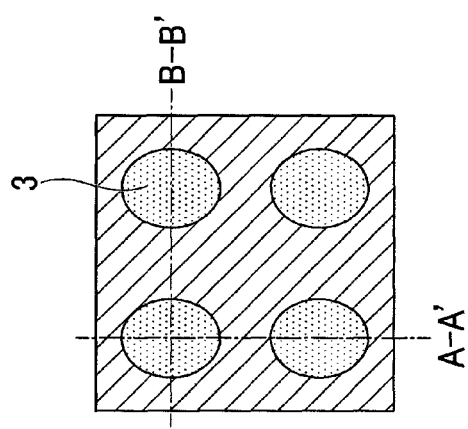
FIG. 2A is a fragmentary plan view illustrating a semiconductor device in a step, subsequent to the step of FIGS. 1A, 1B and 1C, involved in the method of forming the semiconductor device in accordance with the first preferred embodiment of the present invention.

As shown in FIGS. 2A, 2B and 2C, a silicon nitride film having a thickness of 100 nm is formed on the silicon oxide film 2. A patterning process for forming pillars is performed by a lithography process. The silicon nitride film is selectively etched by a dry etching process so as to form a silicon nitride film (first interlayer film) 3. The silicon oxide film 2 is removed by a dry etching process using the silicon nitride film 3 as a hard mask. The silicon substrate 1 is removed by a dry etching process by an amount of 150 nm. The dry etching process is carried out using the silicon nitride film 3 as a hard mask. A plurality of pillars 1A is formed on the surface of the silicon substrate 1. The plurality of pillars 1A extends vertically from the surface of the silicon substrate 1.

Figure 3C:
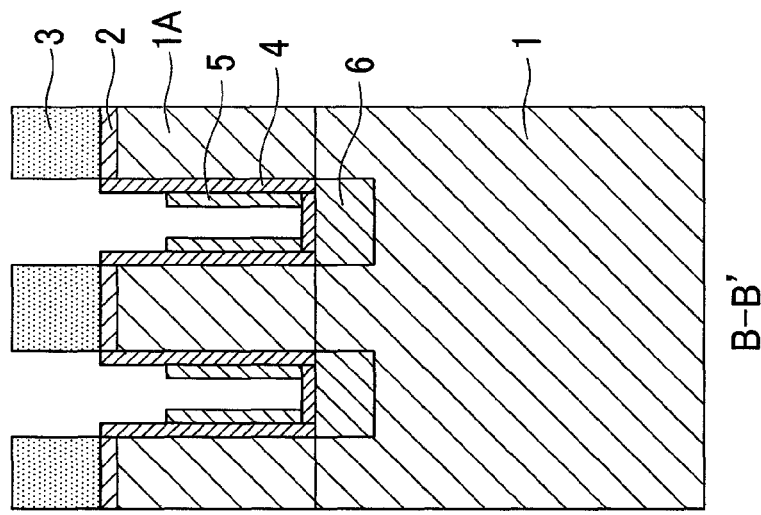
FIG. 3C is a fragmentary cross sectional elevation view illustrating the semiconductor device, taken along a B-B' line of FIG. 3A, in accordance with the first preferred embodiment of the present invention.
Figure 3B:
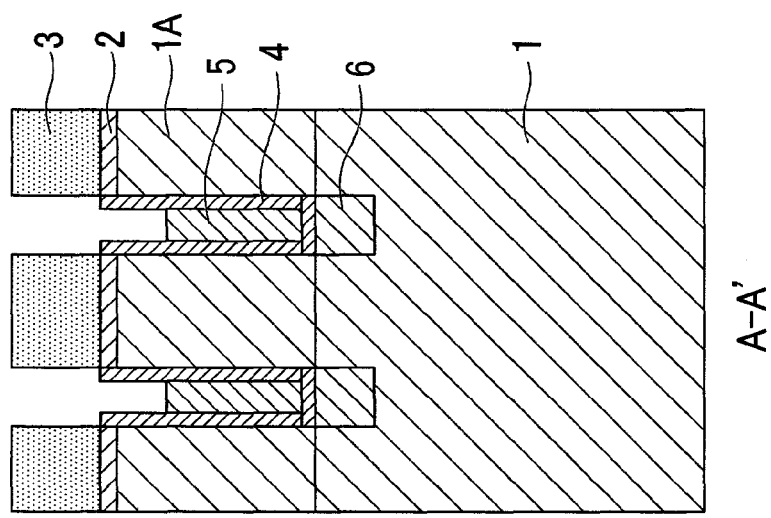
FIG. 3B is a fragmentary cross sectional elevation view illustrating the semiconductor device, taken along an A-A' line of FIG. 3A, in accordance with the first preferred embodiment of the present invention.
Figure 3A:
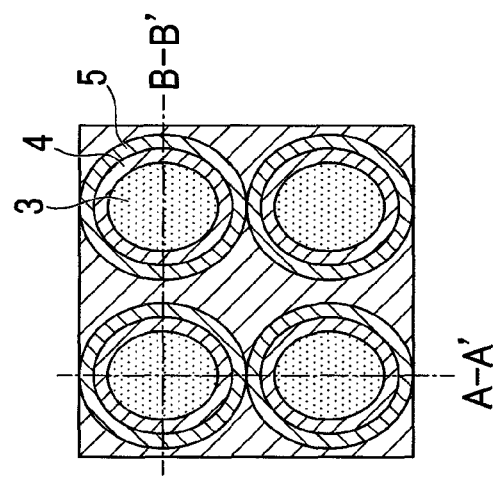
FIG. 3A is a fragmentary plan view illustrating a semiconductor device in a step, subsequent to the step of FIGS. 2A, 2B and 2C, involved in the method of forming the semiconductor device in accordance with the first preferred embodiment of the present invention.

As shown in FIGS. 3A, 3B and 3C, a thermal oxidation is performed at 1000° C. for 10 seconds. An ion-implantation process is carried out to form a lower diffusion layer (first impurity diffusion region) 6 of a vertical MOS transistor. For example, phosphorus may be implanted at 20 KeV and about $1\times10^{15}/cm^2$. An oxide film is removed by a wet etching process. An oxidation process is performed at 1000° C. for 10 seconds so that a gate oxide film (first insulating film) 4 is formed. The gate oxide film 4 covers a side edge surface of the silicon oxide film 2. A polysilicon layer doped in-situ with phosphorus is formed using a CVD method. The polysilicon layer is etched back so as to form a gate electrode (electrode layer) 5.

As shown in FIGS. 4A, 4B and 4C, a silicon oxide film (second insulating film) 7 is formed using a plasma CVD method, so that the silicon oxide film (second insulating film) 7 buries the peripheries of a pillar 1A and of the silicon nitride film 3. The silicon oxide film (second insulating film) 7 is planarized by a CMP process.

As shown in FIGS. 5A, 5B and 5C, the silicon nitride film 3 is removed by a wet etching process, to form a contact hole 8. The contact hole 8 is self-aligned to the pillars 1A. An ion-implantation process is carried out to form an upper diffusion layer (second impurity diffusion region) 15 at the top portions of the pillars 1A of the vertical MOS transistor. Phosphorus may be implanted at 20 KeV and about $1\times10^{15}/cm^2$. The silicon oxide film 2 is removed by a dry etching process. The surface of the upper diffusion layer 15 is exposed, and a portion of the gate oxide film 4 covering the side edge surface of the silicon oxide film 2 is exposed.

As shown in FIGS. 6A, 6B and 6C, the silicon oxide film 7 is etched by the wet etching process by, for example, about 10 nm. The gate oxide film 4 is etched from the upper part (one end) 4a thereof. The side surfaces 15b of the top portions of the pillars 1A are partially exposed.

Figure 7B:
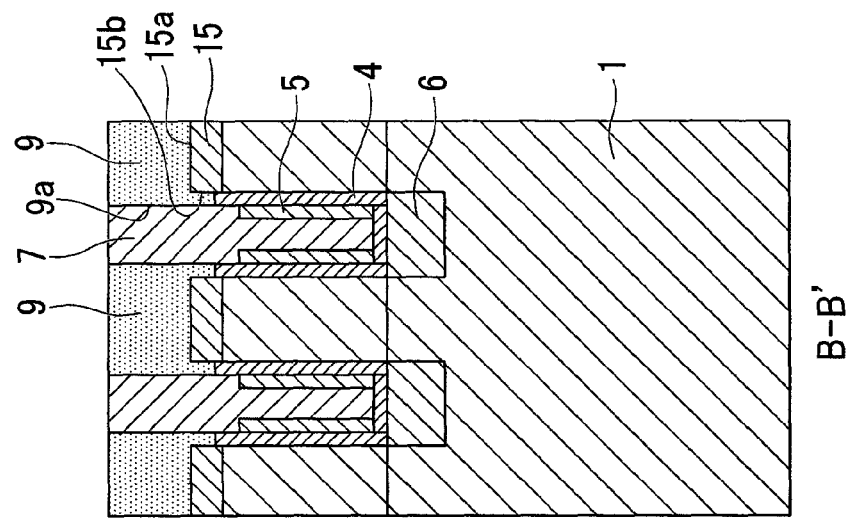
FIG. 7B is a fragmentary cross sectional elevation view illustrating the semiconductor device, taken along an A-A' line of FIG. 7A, in accordance with the first preferred embodiment of the present invention.
Figure 7C:
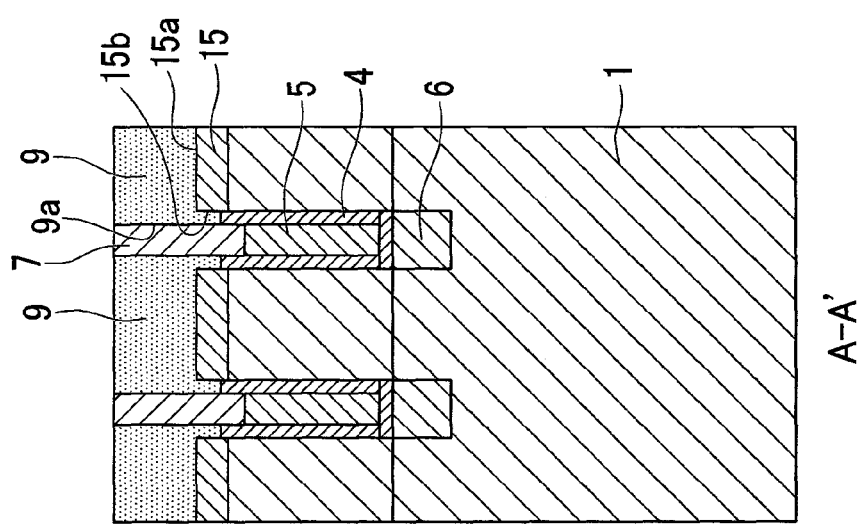
FIG. 7C is a fragmentary cross sectional elevation view illustrating the semiconductor device, taken along a B-B' line of FIG. 7A, in accordance with the first preferred embodiment of the present invention.
Figure 7A:
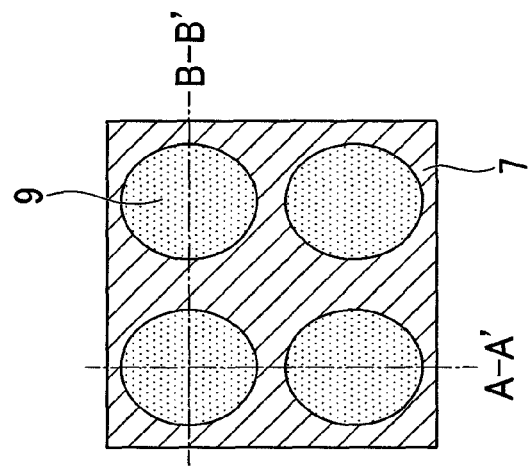
FIG. 7A is a fragmentary plan view illustrating a semiconductor device in a step, subsequent to the step of FIGS. 6A, 6B and 6C, involved in the method of forming the semiconductor device in accordance with the first preferred embodiment of the present invention.

As shown in FIGS. 7A, 7B and 7C, a material is buried in the contact hole 8 in the silicon oxide film 7. The material is planarized by a CMP process, thereby forming a contact plug 9. The contact plug 9 is in contact with an upper diffusion layer 15. The contact hole 8 is self-aligned to the pillars. Thus, the contact plug 9 and the pillars 1A are positioned accurately. The side surfaces 15b of the upper diffusion layer 15 as well as the top surfaces 15a of the upper diffusion layer 15 are exposed. The side surfaces 15b of the upper diffusion layer 15 are buried by the contact plug 9. The top surfaces 15a of the upper diffusion layer 15 are buried by the contact plug 9. The side surface 9a of the contact plug 9 extends along the side surface of the silicon oxide film 7. The contact plug 9 may be formed using the known method.

The semiconductor device of the present embodiment includes the vertical device. The vertical device includes the pillars 1A and the first insulating film 4 on the side surfaces of the pillars 1A. The vertical device also includes the contact plug 9. The contact plug 9 covers the top portions 15a of the pillars 1A and the side surfaces 15b of the top portions 15a. The vertical device also includes the silicon oxide film (second insulating film) 7. The silicon oxide film (second insulating film) 7 buries the peripheries of the pillars 1A and of the gate oxide film 4. The silicon oxide film (second insulating film) 7 extends along the side surface 9a of the contact plug 9. The vertical MOS transistor includes a lower diffusion layer 6, a channel region, and an upper diffusion layer 15. The lower diffusion layer 6 may perform as one of source and drain diffusion layers. The lower diffusion layer 6 is disposed in the substrate 1. The channel region is surrounded by the gate electrode 5 included in the central portion. The upper diffusion layer 15 may perform as the other of source and drain diffusion layers. The upper diffusion layer 15 is positioned at the top portion of the pillar 1A.

In accordance with the semiconductor device, the top portions of the pillars 1A of the vertical MOS transistor is in contact with the contact plug 9. The contact plug 9 is in contact with both the top surfaces 15a and the side surfaces 15b of the pillars 1A. It is possible to increase the contact area and to reduce contact resistance as compared to the configuration of the related art, in which the contact plug is in contact with only the top surface of the pillar. The contact hole 8 is self-aligned to the pillar 1A. In the contact hole 8 is filled with a contact material to form and the contact plug 9.

Second Embodiment

A method of manufacturing a semiconductor device according to a second embodiment of the present invention will be described.

Figure 8C:
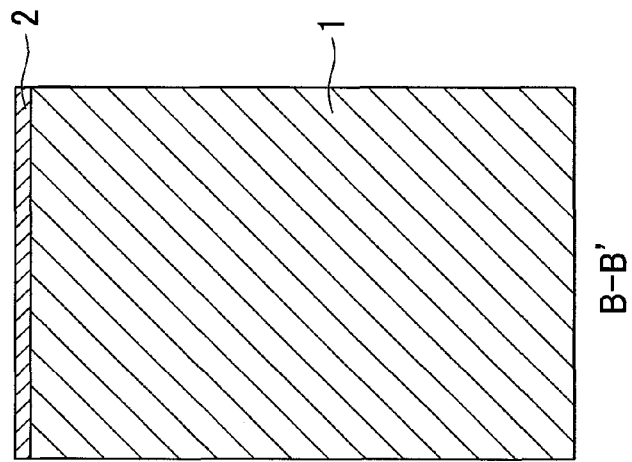
FIG. 8C is a fragmentary cross sectional elevation view illustrating the semiconductor device, taken along a B-B' line of FIG. 8A, in accordance with the second preferred embodiment of the present invention.
Figure 8B:
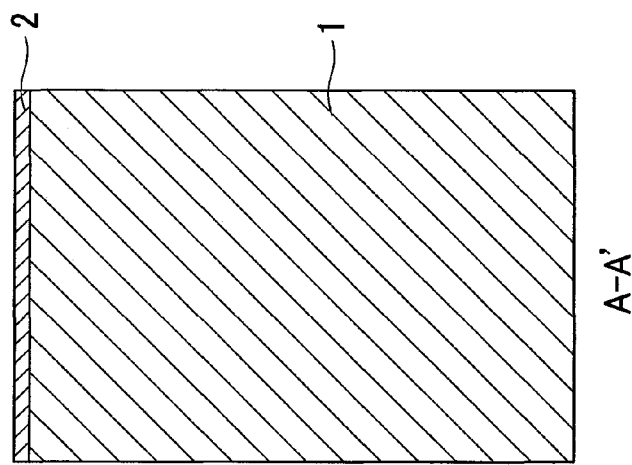
FIG. 8B is a fragmentary cross sectional elevation view illustrating the semiconductor device, taken along an A-A' line of FIG. 8A, in accordance with the second preferred embodiment of the present invention.
Figure 8A:
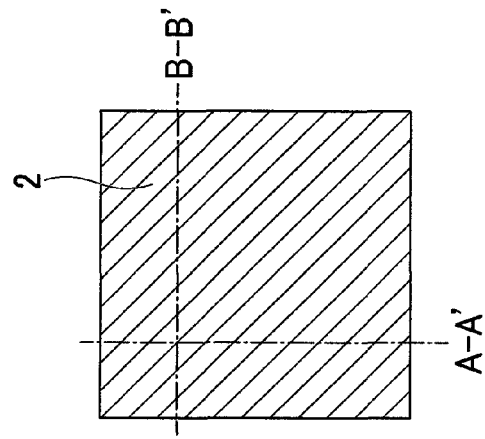
FIG. 8A is a fragmentary plan view illustrating a semiconductor device in a step involved in a method of forming the semiconductor device in accordance with a second preferred embodiment of the present invention.

As shown in FIGS. 8A, 8B and 8C, a silicon substrate 1 is thermally oxidized at 1000° C. for 15 seconds so as to form a silicon oxide film (second interlayer film) 2 on the surface of the silicon substrate 1.

Figure 9C:
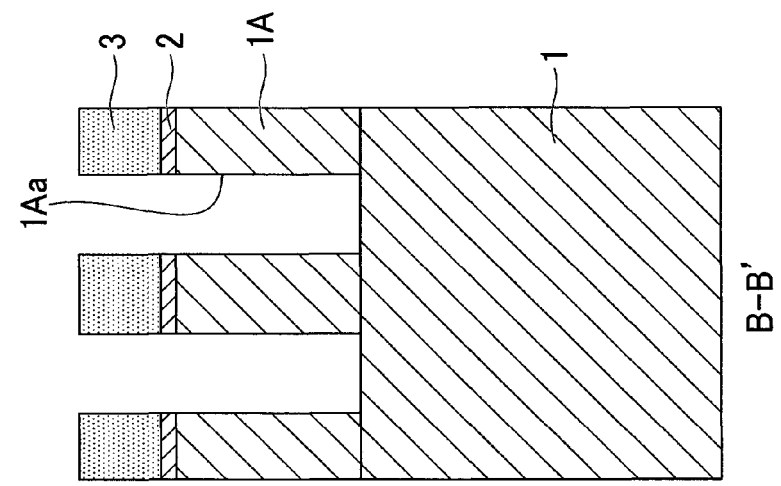
FIG. 9C is a fragmentary cross sectional elevation view illustrating the semiconductor device, taken along a B-B' line of FIG. 9A, in accordance with the second preferred embodiment of the present invention.
Figure 9B:
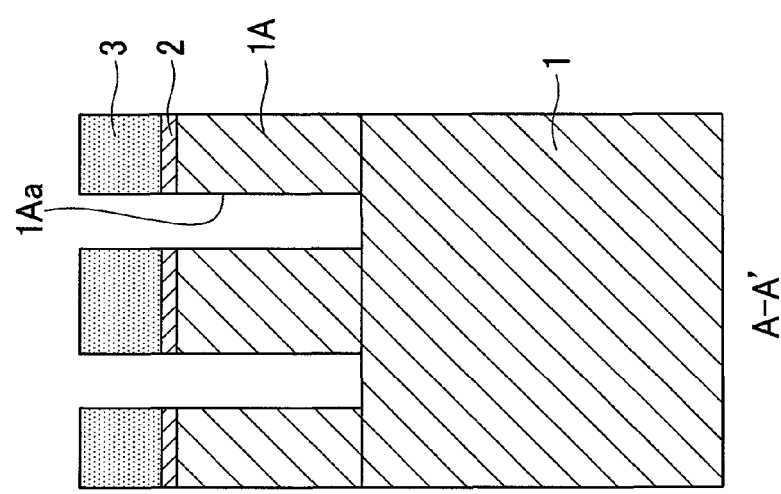
FIG. 9B is a fragmentary cross sectional elevation view illustrating the semiconductor device, taken along an A-A' line of FIG. 9A, in accordance with the second preferred embodiment of the present invention.
Figure 9A:
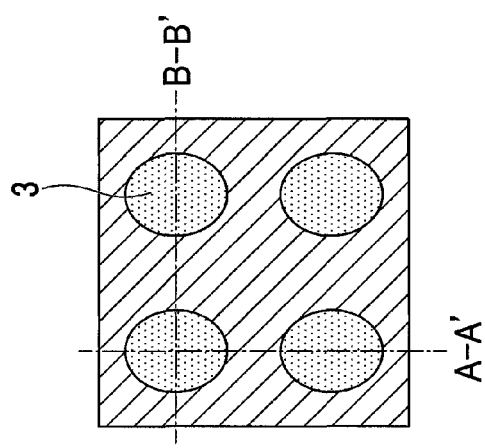
FIG. 9A is a fragmentary plan view illustrating a semiconductor device in a step, subsequent to the step of FIGS. 8A, 8B and 8C, involved in the method of forming the semiconductor device in accordance with the second preferred embodiment of the present invention.

As shown in FIGS. 9A, 9B and 9C, silicon nitride film 3 having a pillar pattern and having a thickness of 100 nm is formed on the silicon oxide film 2. The silicon oxide film 2 and the silicon substrate 1 are removed by a dry etching process using the silicon nitride film (first interlayer film) 3 as a hard mask, so as to form a plurality of column-shaped pillars 1A on the surface of the silicon substrate 1.

Figure 10C:
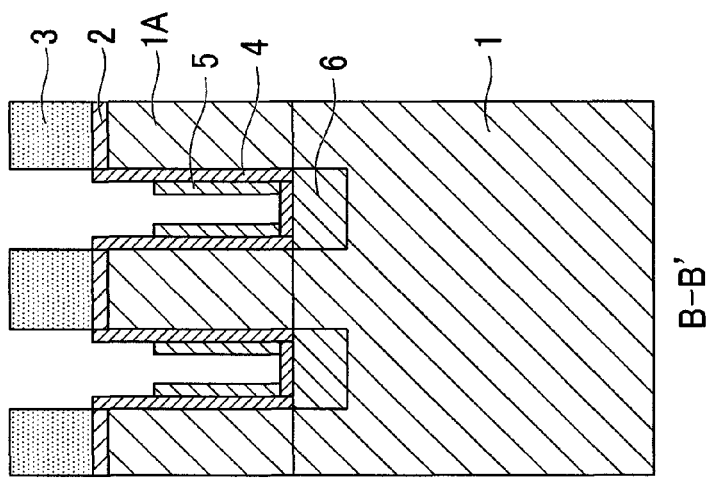
FIG. 10C is a fragmentary cross sectional elevation view illustrating the semiconductor device, taken along a B-B' line of FIG. 10A, in accordance with the second preferred embodiment of the present invention.
Figure 10B:
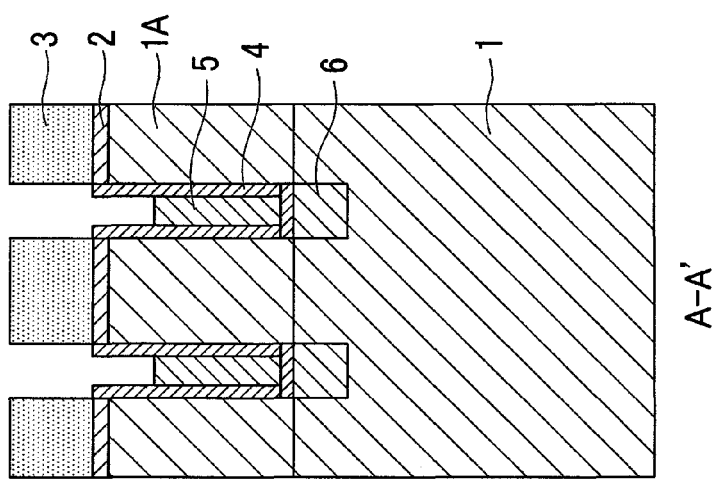
FIG. 10B is a fragmentary cross sectional elevation view illustrating the semiconductor device, taken along an A-A' line of FIG. 10A, in accordance with the second preferred embodiment of the present invention.
Figure 10A:
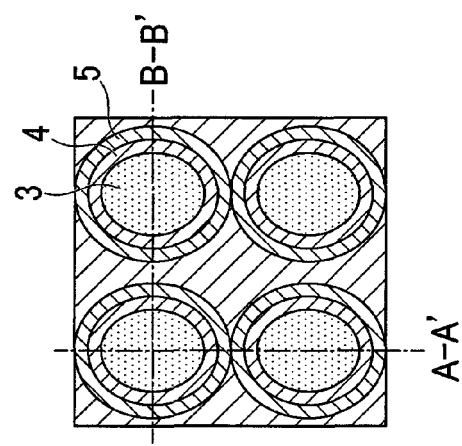
FIG. 10A is a fragmentary plan view illustrating a semiconductor device in a step, subsequent to the step of FIGS. 9A, 9B and 9C, involved in the method of forming the semiconductor device in accordance with the second preferred embodiment of the present invention.

As shown in FIGS. 10A, 10B and 10C, a thermal oxidation process is performed at 1000° C. for 10 seconds. An ion-implantation process is carried out to form a lower diffusion layer 6 of a vertical MOS transistor. Phosphorus may be implanted so as to form a lower diffusion layer 6 of a vertical MOS transistor. An oxide film is removed by a wet etching process. An oxidation process is performed to form a gate oxide film (first insulating film) 4. The gate oxide film 4 covers a side edge surface of the silicon oxide film 2. A polysilicon layer doped in-situ with phosphorus is formed using a CVD method. The polysilicon layer is etched back so as to form a gate electrode (electrode layer) 5.

As shown in FIGS. 11A, 11B and 11C, a silicon oxide film (second insulating film) 7 fills a gap between the pillars 1A and the silicon nitride film 3. The silicon oxide film (second insulating film) 7 is planarized by a CMP process.

Figure 12C:
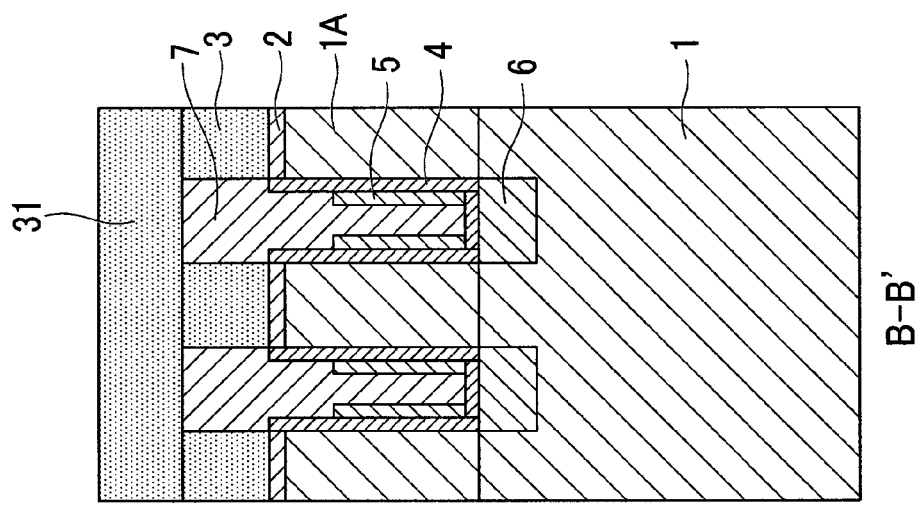
FIG. 12C is a fragmentary cross sectional elevation view illustrating the semiconductor device, taken along a B-B' line of FIG. 12A, in accordance with the second preferred embodiment of the present invention.
Figure 12B:
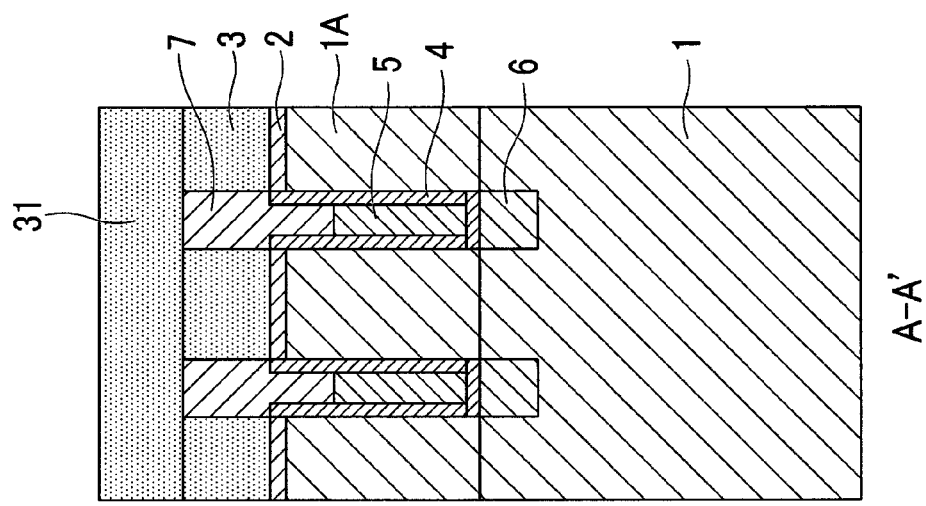
FIG. 12B is a fragmentary cross sectional elevation view illustrating the semiconductor device, taken along an A-A' line of FIG. 12A, in accordance with the second preferred embodiment of the present invention.
Figure 12A:
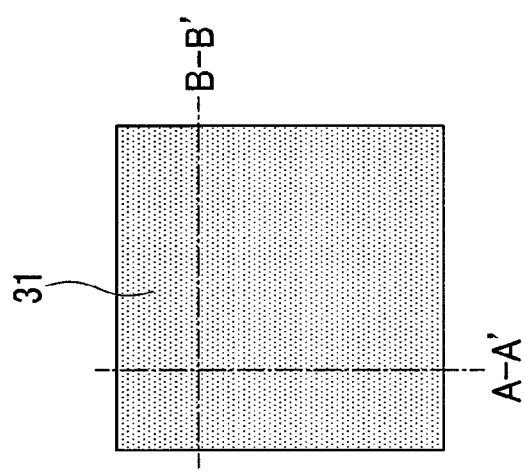
FIG. 12A is a fragmentary plan view illustrating a semiconductor device in a step, subsequent to the step of FIGS. 11A, 11B and 11C, involved in the method of forming the semiconductor device in accordance with the second preferred embodiment of the present invention.

As shown in FIGS. 12A, 12B and 12C, a silicon nitride film 31 is formed on the planarized silicon oxide film 7 and the silicon nitride film 3.

Figure 13C:
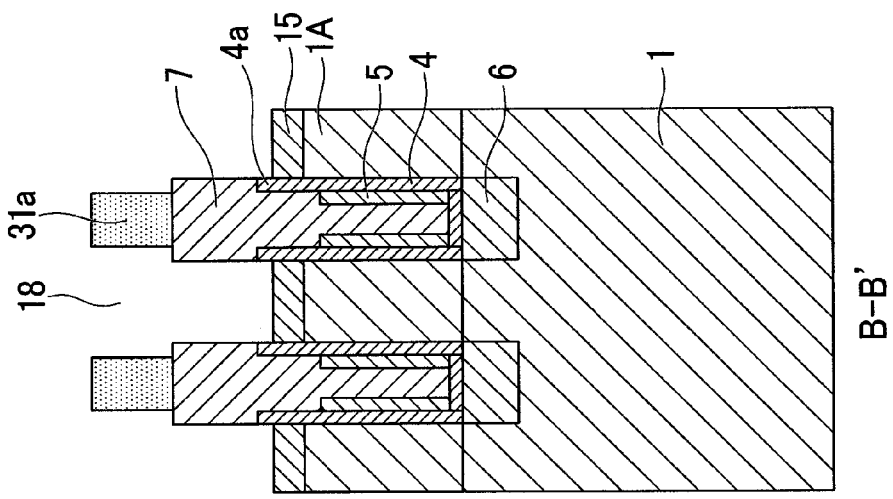
FIG. 13C is a fragmentary cross sectional elevation view illustrating the semiconductor device, taken along a B-B' line of FIG. 13A, in accordance with the second preferred embodiment of the present invention.
Figure 13B:
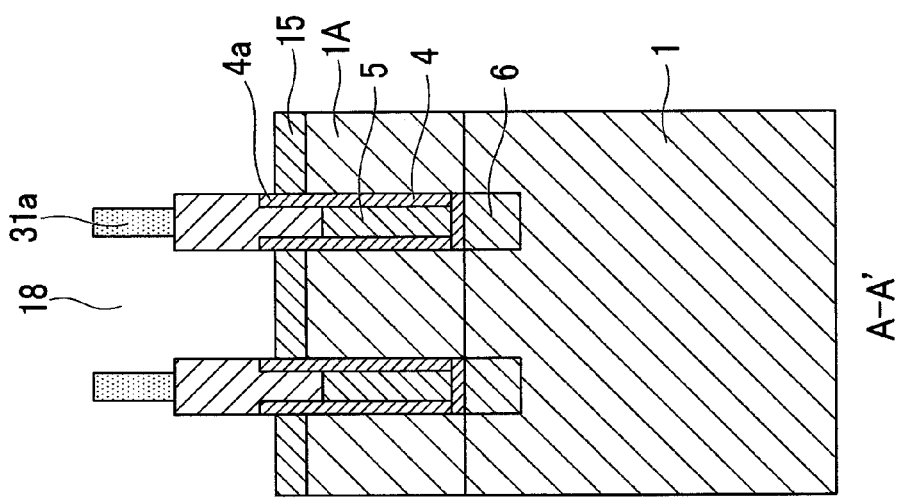
FIG. 13B is a fragmentary cross sectional elevation view illustrating the semiconductor device, taken along an A-A' line of FIG. 13A, in accordance with the second preferred embodiment of the present invention.
Figure 13A:
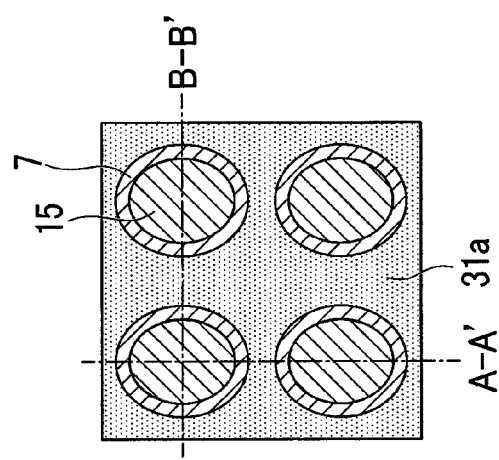
FIG. 13A is a fragmentary plan view illustrating a semiconductor device in a step, subsequent to the step of FIGS. 12A, 12B and 12C, involved in the method of forming the semiconductor device in accordance with the second preferred embodiment of the present invention.

As shown in FIGS. 13A, 13B and 13C, the silicon nitride film 31 is patterned using a lithography technique so that the silicon nitride film 31 has a pattern of contact plug. The silicon nitride film (third insulating film) 31a and the silicon nitride film 3 are removed by a dry etching process under conditions that the silicon nitride film (third insulating film) 31a and the silicon nitride film 3 are higher in etching selectivity to the silicon oxide film 7. The patterned silicon nitride film 31a is patterned so that the width thereof corresponds to the width of the contact plug 9. By a dry etching process, the contact hole 18 is self-aligned to the pillars 1A. An ion-implantation process is carried out to form an upper diffusion layer (second impurity diffusion region) 15. The ion-implantation process introduces impurity into the top portions of the pillars 1A of the vertical MOS transistor. Phosphorus may be implanted at 20 KeV and about $1\times10^{15}/cm^2$. The silicon oxide film 2 is removed by a dry etching process so that the surface of the upper diffusion layer 15 is exposed, and that a portion 4a of the gate oxide film 4 covering the side edge surface of the silicon oxide film 2 is exposed.

Figure 14C:
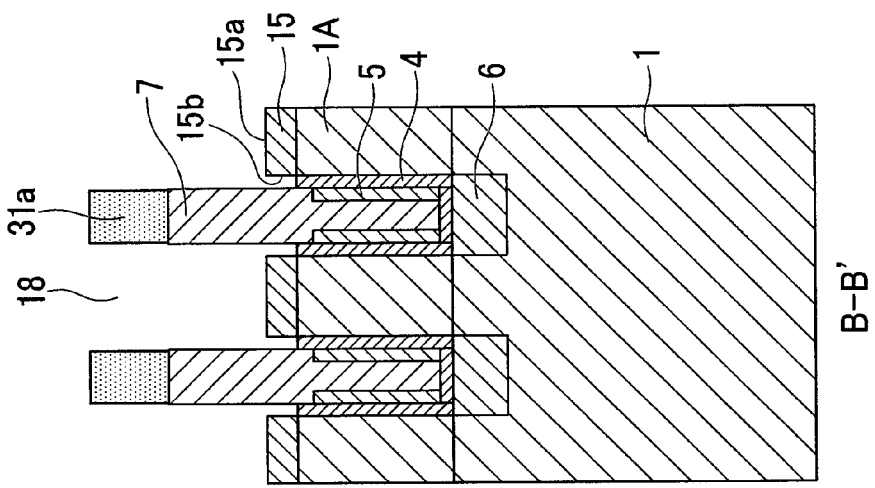
FIG. 14C is a fragmentary cross sectional elevation view illustrating the semiconductor device, taken along a B-B' line of FIG. 14A, in accordance with the second preferred embodiment of the present invention.
Figure 14B:
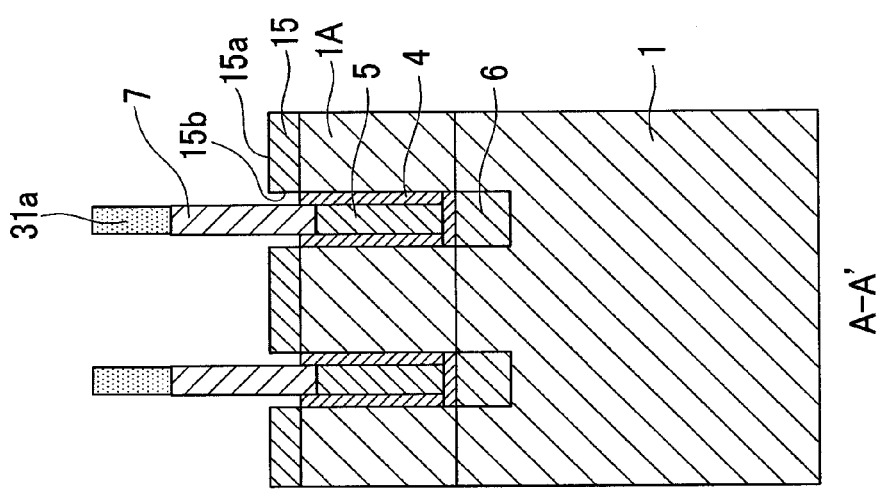
FIG. 14B is a fragmentary cross sectional elevation view illustrating the semiconductor device, taken along an A-A' line of FIG. 14A, in accordance with the second preferred embodiment of the present invention.
Figure 14A:
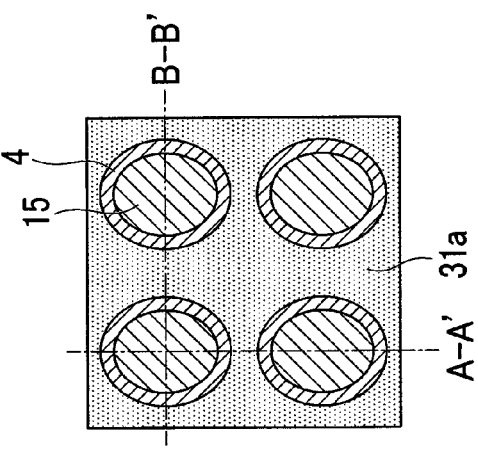
FIG. 14A is a fragmentary plan view illustrating a semiconductor device in a step, subsequent to the step of FIGS. 13A, 13B and 13C, involved in the method of forming the semiconductor device in accordance with the second preferred embodiment of the present invention.

As shown in FIGS. 14A, 14B and 14C, the silicon oxide film 7 is etched by a wet etching process by, for example, an amount of about 10 nm. The gate oxide film 4 is etched from the upper part (one end) 4a thereof. The etching process exposes ion-implantation process the side surfaces 15a of the top portions of the pillars 1A.

Figure 15C:
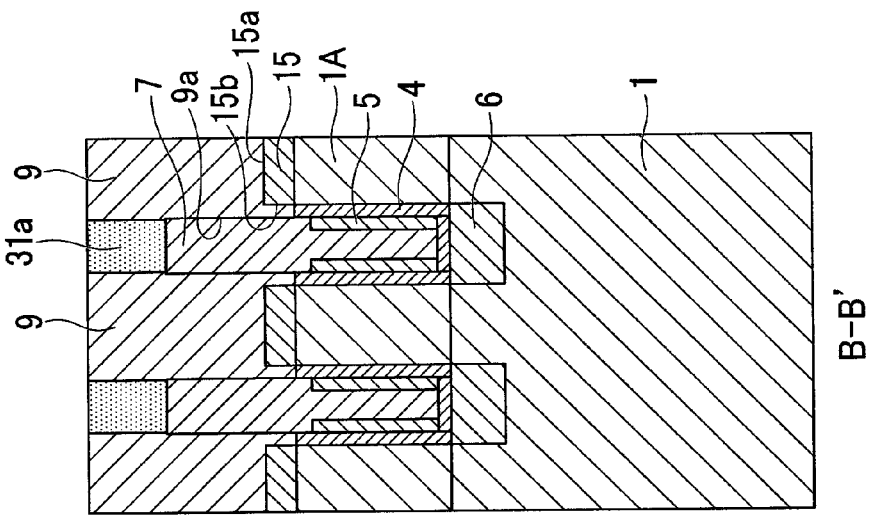
FIG. 15C is a fragmentary cross sectional elevation view illustrating the semiconductor device, taken along a B-B' line of FIG. 15A, in accordance with the second preferred embodiment of the present invention.
Figure 15B:
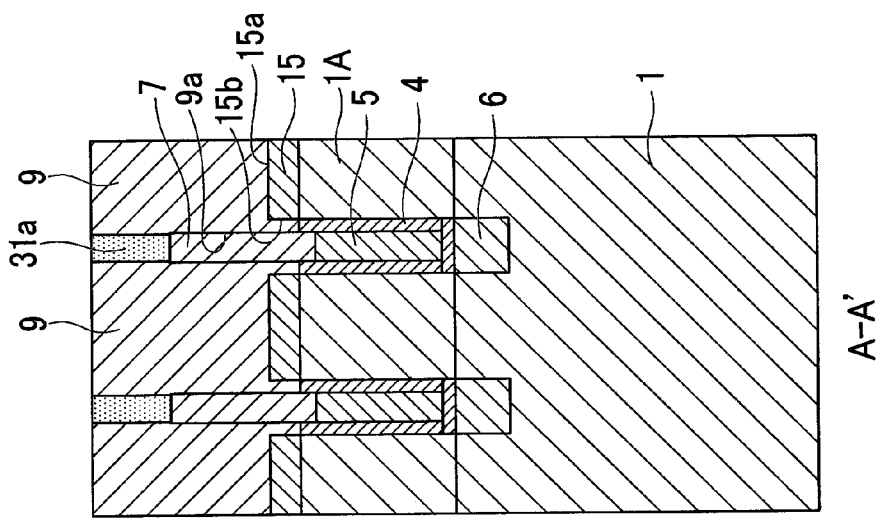
FIG. 15B is a fragmentary cross sectional elevation view illustrating the semiconductor device, taken along an A-A' line of FIG. 15A, in accordance with the second preferred embodiment of the present invention.
Figure 15A:
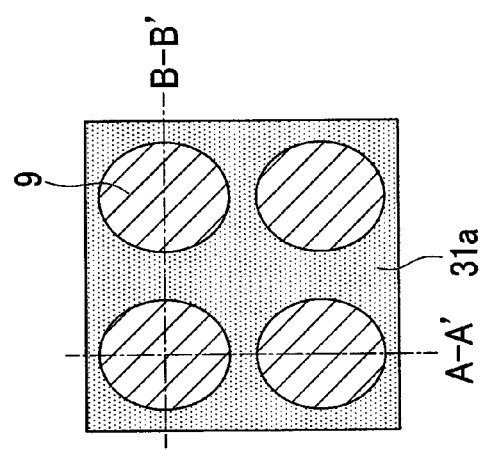
FIG. 15A is a fragmentary plan view illustrating a semiconductor device in a step, subsequent to the step of FIGS. 14A, 14B and 14C, involved in the method of forming the semiconductor device in accordance with the second preferred embodiment of the present invention.

As shown in FIGS. 15A, 15B and 15C, a material is buried in the contact hole 18 in the silicon oxide film 7 and the silicon nitride (third insulating film) 31a. The material is planarized by a CMP process so as to form a contact plug 9, which is in contact with the upper diffusion layer 15. The contact hole 18 is self-aligned to the pillars. The contact plug 9 and the pillars 1A are positioned at a high accuracy. The side surfaces of the top surfaces as well as the top surfaces of the pillars 1A are exposed. The contact plug 9 covers the side surfaces as well as the top surfaces of the pillars 1A. The side surface 9a of the contact plug 9 extends along the side surface of the silicon oxide film 7 and the silicon nitride film 31a. The contact plug 9 may be formed using the known method.

The semiconductor device manufactured by the above-described method in accordance with the present embodiment may further include the silicon nitride film 31a. The silicon nitride film 31a extends along the side surface 9a of the contact plug 9. The silicon nitride film 31a is disposed on the silicon oxide film 7.

Third Embodiment

Figure 16:
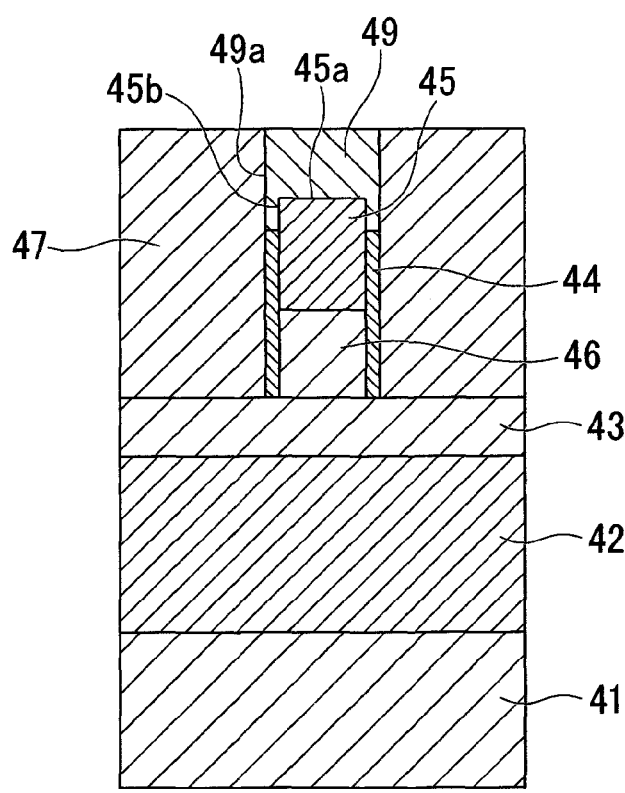
FIG. 16 is a fragmentary cross sectional elevation view illustrating a semiconductor device including a vertical diode in accordance with another embodiment of the present invention.

A method of manufacturing a semiconductor device according to a second embodiment of the present invention will be described. FIG. 16 is a cross-sectional view of a semiconductor device according to a third embodiment of the present invention. The semiconductor devices shown in FIGS. 1A to 15C each include the vertical transistors as a vertical device. FIG. 16 shows an example of a semiconductor device including a vertical diode as a vertical device.

As shown in FIG. 16, a semiconductor device includes a vertical diode. The vertical diode includes a pillar, and an upper diffusion layer (second impurity diffusion layer) 45. The upper diffusion layer (second impurity diffusion layer) 45 is disposed on the top portions of the pillar. The vertical diode also includes an insulating film (first insulating film) 44. The insulating film (first insulating film) 44 is disposed on a side surface of the pillar. The semiconductor device also includes a contact plug 49. The contact plug 49 covers at least a portion of a top surface 45a of the pillar. The contact plug 49 covers a side surface 45b of the top portion thereof. The second insulating film 47 covers the peripheries the pillar and the insulating film 44. The second insulating film 47 extends along a side surface 49a of the contact plug 49. The vertical diode includes a lower diffusion layer (first impurity diffusion layer) 46.

Both the upper diffusion layer 45 of the pillar of the vertical diode and the contact plug 49 connected thereto are in contact with the side surface 45b of the top portion of the pillar as well as with the top surface 45a of the pillar. The contact area is increased, and the contact resistance is reduced, as compared to the configuration of the related art in which the contact plug is in contact with only the top surface of the pillar. The reference numeral 41 denotes a substrate 41 and the reference numeral 42 denotes a buffer layer 42.

Modifications

Figure 17:
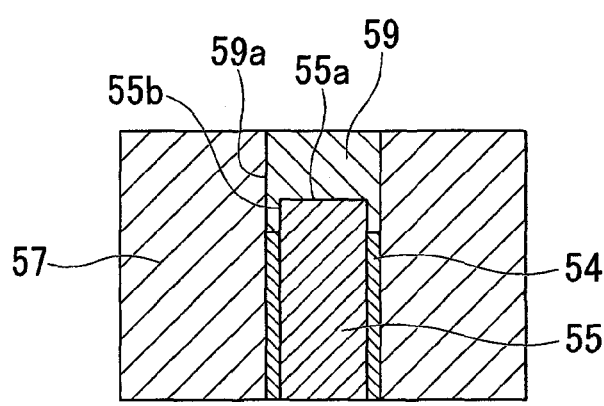
FIG. 17 is a fragmentary cross sectional elevation view illustrating a semiconductor device including another vertical device in accordance with still another embodiment of the present invention.

FIG. 17 is a cross-sectional view of a semiconductor device according to a modification to the third embodiment of the present invention.

A semiconductor device includes a vertical device. The vertical device includes a pillar 55. The pillar 55 includes an upper diffusion layer (second impurity diffusion layer). The vertical device includes an insulating film (first insulating film) 54. The insulating film (first insulating film) 54 is disposed on a side surface of the pillar 55. The semiconductor device includes a contact plug 59. The contact plug 59 covers at least a portion of a top surface 55a of the pillar and a portion of a side surface 55b thereof. The semiconductor device includes a second insulating film 57. The second insulating film 57 covers the peripheries of the pillar and the insulating film 54. The second insulating film 57 extends along a side surface 59a of the contact plug 59.

The contact plug 59 is in contact with both the side surface 55b as well as the top surface 55a of the pillar 55. The contact area is increased and the contact resistance is reduced, as compared to the configuration of the related art in which the contact plug is in contact with only the top surface of the pillar.

Figure 18:
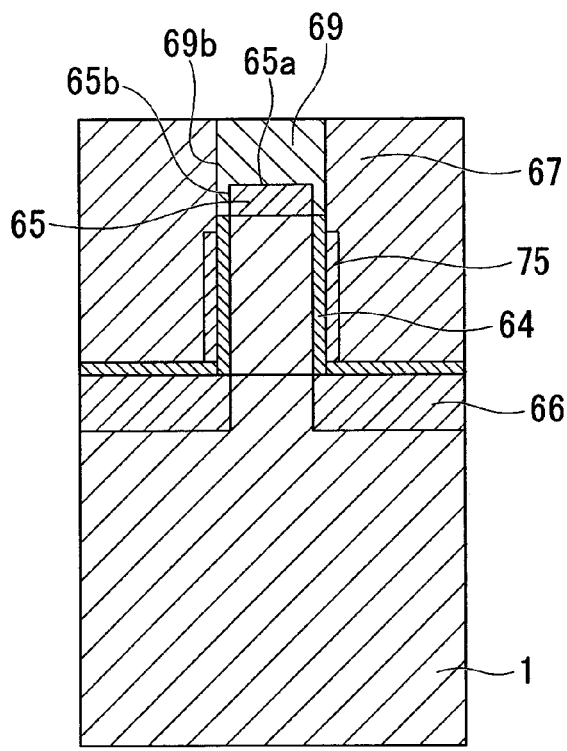
FIG. 18 is a fragmentary cross sectional elevation view illustrating a semiconductor device including a vertical MOS transistor in accordance with still another embodiment of the present invention.

FIG. 18 is a cross-sectional view of a semiconductor device according to another modification to the third embodiment of the present invention. The semiconductor devices shown in FIGS. 1A to 15C each include the plurality of vertical MOS transistors. FIG. 18 shows a semiconductor device including a single vertical MOS transistor.

A semiconductor device includes a vertical MOS transistor. The vertical MOS transistor includes an upper diffusion layer 65 on a top portion of a pillar. The vertical MOS transistor also includes an insulating film (first insulating film) 64. The insulating film (first insulating film) 64 is disposed on a side surface of the pillar. The semiconductor device includes a contact plug 69 that covers at least a portion of an overall surface of a top surface 65a of the pillar and a side surface 65b thereof. The semiconductor device includes a second insulating film 67. The second insulating film 67 covers the pillar and the insulating film 64. The second insulating film 67 extends along a side surface 69a of the contact plug 69. Reference numeral 75 denotes a gate electrode.

Figure 19:
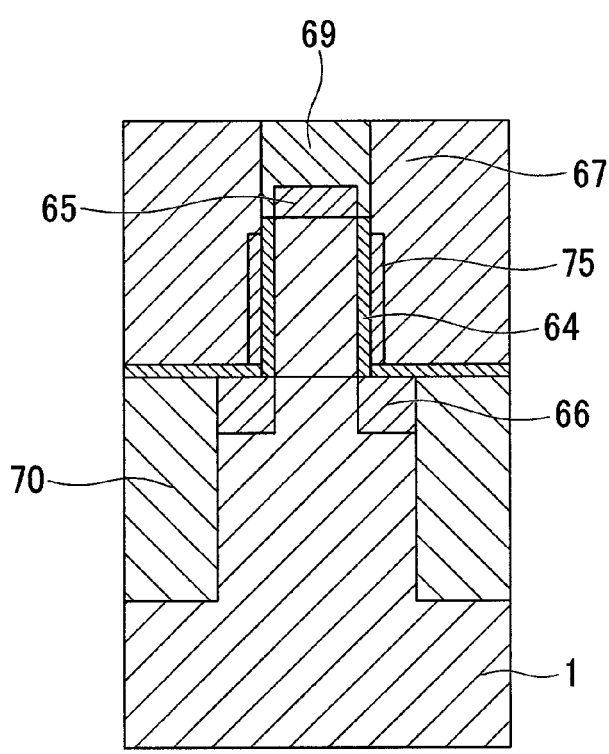
FIG. 19 is a fragmentary cross sectional elevation view illustrating a semiconductor device including a vertical MOS transistor in accordance with still another embodiment of the present invention.

The contact plug 69 is in contact with the side surface 65b and the top surface 65a of the upper diffusion layer 65 of the pillar. The contact area is increased and the contact resistance is reduced, as compared to the configuration of the related art in which the contact plug is in contact with only the top surface of the pillar. FIG. 19 shows a modified example of the semiconductor device of FIG. 18. The vertical MOS transistor shown in FIG. 18 can be isolated by an isolation region 70 in the substrate 1.

Fourth Embodiment

Figures 20A, 20B:
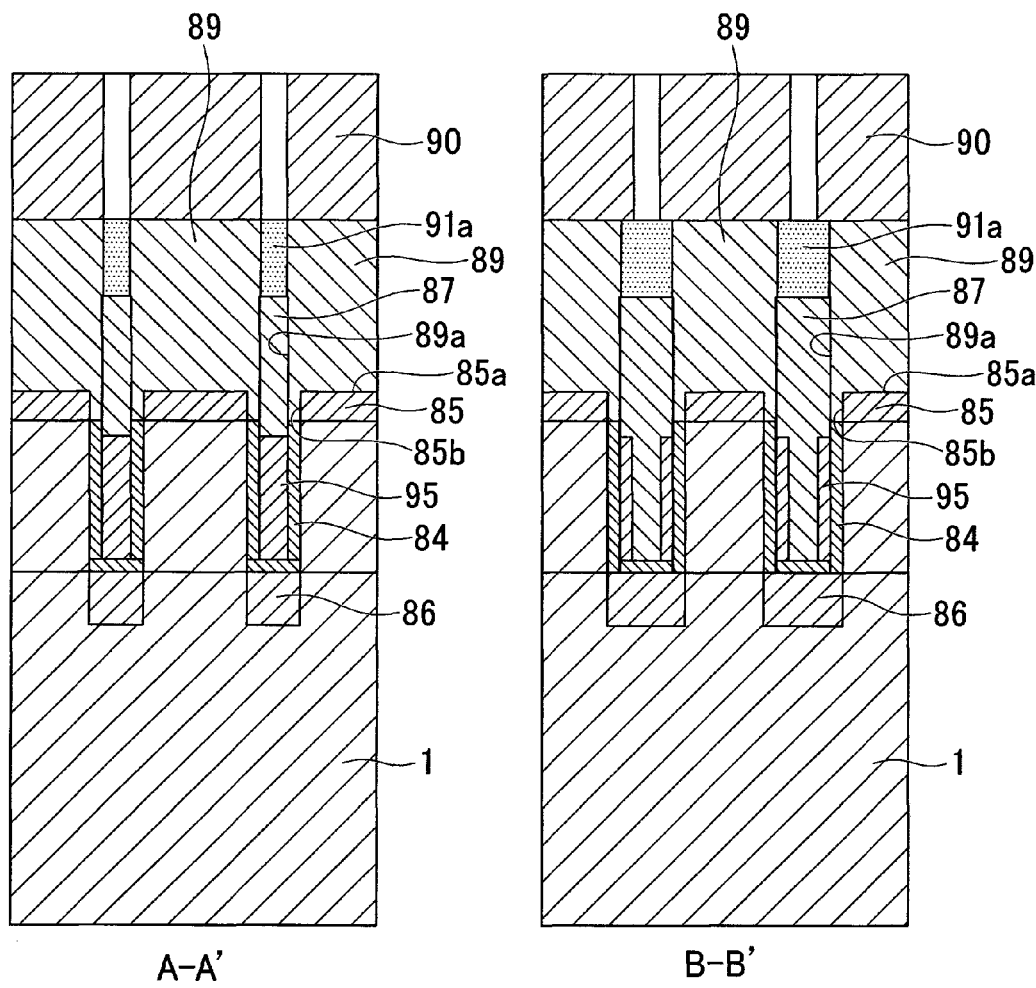
FIG. 20A is a fragmentary cross sectional elevation view illustrating a semiconductor device including a vertical MOS transistor and a capacitor in accordance with another embodiment of the present invention.
FIG. 20B is a fragmentary cross sectional elevation view illustrating a semiconductor device including a vertical MOS transistor and a capacitor in accordance with another embodiment of the present invention.

FIG. 20 is a cross-sectional elevation view of a semiconductor device according to a fourth embodiment of the present invention. FIG. 20 shows an example of a DRAM connected to a vertical MOS transistor and including a capacitor.

A semiconductor device (DRAM) includes a vertical MOS transistor. The vertical MOS transistor includes a pillar and an upper diffusion layer 85 on the top portion of the pillar. The vertical MOS transistor includes an insulating film (first insulating film) 84 on side surfaces of the pillars. The semiconductor device (DRAM) includes a contact plug 89. The contact plug 89 covers at least a portion of the top surface 85a of the pillar and a side surface 85b thereof. The semiconductor device (DRAM) includes a second insulating film 87. The second insulating film 87 surrounds the pillars and the insulating film 84. The second insulating film 87 extends along a side surface 89a of the contact plug 89. The semiconductor device (DRAM) includes a silicon nitride film (third insulating film) 91a. The silicon nitride film (third insulating film) 91a is in contact with a side surface 89a of the contact plug 89. The silicon nitride film (third insulating film) 91a is disposed on the second insulating film 87. The semiconductor device (DRAM) includes a capacitor 90 connected to the contact plug 89. The capacitor 90 is disposed over the contact plug 89. The reference numeral 95 denotes a gate electrode.

Figure 21:
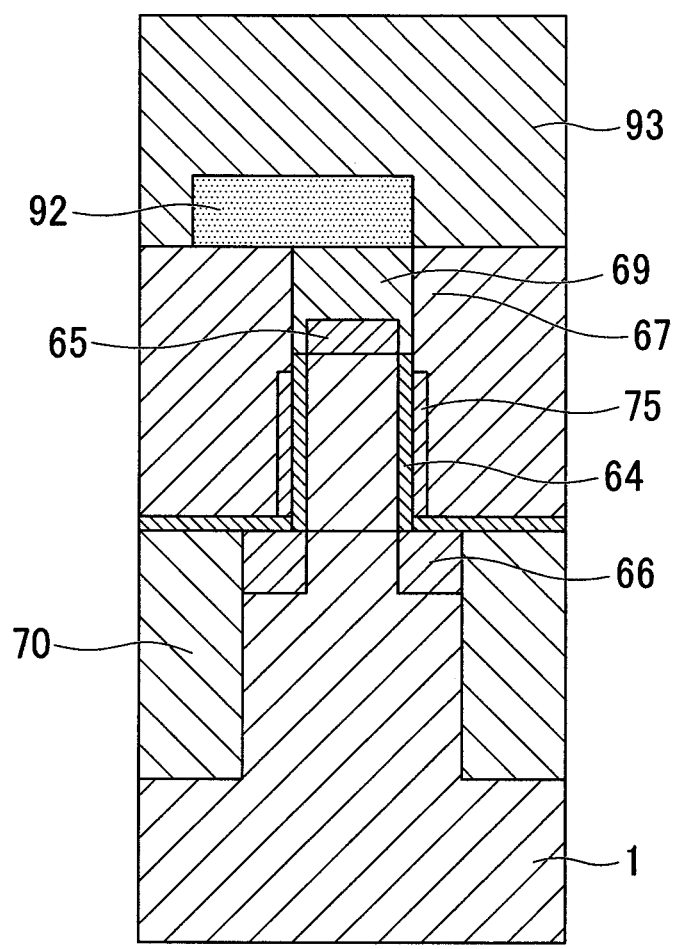
FIG. 21 is a fragmentary cross sectional elevation view illustrating a semiconductor device including a vertical MOS transistor in accordance with still another embodiment of the present invention.

The contact plug 89 is in contact with both the side surfaces 85b of the pillars as well as the top surfaces 85a of the pillars. The contact area is increased and contact resistance is reduced, as compared to the configuration of the related art in which the contact plug is in contact with only the top surface of the pillar. FIG. 21 shows a modification to the semiconductor device of FIG. 19. A wiring layer 92 is disposed on the contact plug 69. An interlayer insulating film 93 is disposed, which covers the wiring layer 92 and the contact plug 69. Reference numeral 93 denotes an interlayer insulating film 93.

A semiconductor device and a method of manufacturing the semiconductor device according to the present invention are applicable to a semiconductor device including a vertical device including a pillar connected to a contact plug, and a method of manufacturing the same.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device, comprising:
a semiconductor substrate;
first and second impurity diffusion regions formed on the semiconductor substrate so that a top surface of the semiconductor substrate is defined by a space between the first and second impurity regions;
a semiconductor pillar projecting from the top surface of the semiconductor substrate;
a third impurity diffusion region formed on a top portion of the semiconductor pillar;
a gate insulating film having a first main surface contacting a side surface of the semiconductor pillar and the first and second impurity diffusion regions, the first main surface further contacting a lower portion of a sidewall of the third impurity diffusion region so that an upper portion other than the lower portion of the sidewall of the third impurity diffusion region is not covered with the gate insulating film;
a gate electrode formed on a second main surface of a lower portion of the gate insulating film so that an upper portion other than the lower portion of the gate insulating film is not covered with the gate electrode, the second main surface opposing to the first main surface; and
a contact plug contacting a top surface and the upper portion of the sidewall of the third impurity diffusion region and an end of the gate insulating film.

2. The semiconductor device as claimed in claim 1, further comprising:
a first insulation layer contacting the gate electrode, the upper portion of the gate insulating film and the contact plug.

3. The semiconductor device as claimed in claim 2, further comprising:

a second insulation layer formed on the first insulating layer and contacting the contact plug, the second insulation layer being different in material from the first insulation layer; and a capacitor contacting the contact plug and the second insulation layer.

4. A semiconductor device, comprising:

a semiconductor member;

first and second impurity diffusion regions formed on the semiconductor member so that a top surface of the semiconductor member is defined by a space between the first and second impurity regions;

a semiconductor portion formed on the top surface of the semiconductor substrate;

a third impurity diffusion region formed on a top portion of the semiconductor portion;

a gate insulating film having a first main surface contacting a side surface of the semiconductor portion and the first and second impurity diffusion regions, the first main surface further contacting a lower portion of a sidewall of the third impurity diffusion region so that an upper portion other than the lower portion of the sidewall of the third impurity diffusion region is not covered with the gate insulating film;

a gate electrode formed on a second main surface of a lower portion of the gate insulating film so that an upper portion other than the lower portion of the gate insulating film is not covered with the gate electrode, the second main surface opposing to the first main surface; and a contact plug contacting a top surface and the upper portion of the side wall of the third impurity diffusion region and an end of the gate insulating film.

5. The semiconductor device as claimed in claim 4, further comprising:

a first insulation layer contacting the gate electrode, the upper portion of the gate insulating film and the contact plug.

6. The semiconductor device as claimed in claim 5, further comprising:

a second insulation layer formed on the first insulating layer and contacting the contact plug, the second insulation layer being different in material from the first insulation layer; and a capacitor contacting the contact plug and the second insulation layer.

7. A semiconductor device, comprising:

a semiconductor member;

a first semiconductor portion formed on the semiconductor member;

a second semiconductor portion formed on the semiconductor member and apart from the first semiconductor portion in a first direction with a first distance;

a third semiconductor portion formed on the semiconductor member and apart from the first semiconductor portion in a second direction perpendicular to the first direction with a second distance smaller than the first distance;

an impurity diffusion region formed on a top portion of the first, second and third semiconductor portions;

a gate insulating film having a first main surface contacting a side surface of the first, second and third semiconductor portions, the first main surface further contacting a lower portion of a sidewall of the impurity diffusion region so that an upper portion other than the lower portion of the sidewall of the impurity diffusion region is not covered with the gate insulating film;

a gate electrode formed on a second main surface of a lower portion of the gate insulating film so that an upper portion other than the lower portion of the gate insulating film is not covered with the gate electrode, the second main surface opposing to the first main surface, the gate electrode including first and second gate electrode portions provided between the first and second semiconductor portions and separated from each other, the gate electrode further including a third gate electrode portion continuously provided from the first semiconductor portion to the third semiconductor portion;

first to third contact plugs provided over the first to third semiconductor portions respectively, the first to third contact plugs contacting a top surface and the upper portion of the side wall of the impurity diffusion region and an end of the gate insulating film; and a first insulating layer formed between the first and second contact plugs so as to be provided between the first and second gate electrode portions, the first insulating layer further being formed between the first and third contact plugs so as to be provided on the third gate electrode portion.

8. The semiconductor device as claimed in claim 7, further comprising:

a second insulating layer formed on the first insulating layer, the second insulating layer being provided between the first and second contact plugs and between the first and third contact plugs, the second insulation layer being different in material from the first insulation layer.

9. The semiconductor device as claimed in claim 8, further comprising;

first to third capacitors formed on the first to third contact plugs, respectively.

* * * * *